United States Patent
Hirler et al.

(10) Patent No.: US 7,750,428 B2
(45) Date of Patent: Jul. 6, 2010

(54) SEMICONDUCTOR DEVICE AND METHOD FOR PRODUCING IT

(75) Inventors: Franz Hirler, Isen (DE); Elmar Falck, Ottobrunn (DE); Hans-Joachim Schulze, Taufkirchen (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 12/112,279

(22) Filed: Apr. 30, 2008

(65) Prior Publication Data

US 2008/0265277 A1    Oct. 30, 2008

(30) Foreign Application Priority Data

Apr. 30, 2007    (DE) .................. 10 2007 020 658

(51) Int. Cl.
*H01L 29/739*    (2006.01)
*H01L 29/78*    (2006.01)
*H01L 29/423*    (2006.01)
*H01L 21/76*    (2006.01)
*H01L 21/58*    (2006.01)

(52) U.S. Cl. ............... 257/488; 257/409; 257/E29.007; 257/E29.123

(58) Field of Classification Search ........................ None
See application file for complete search history.

(56) References Cited

U.S. PATENT DOCUMENTS

| | | | |
|---|---|---|---|
| 5,043,781 A | 8/1991 | Nishiura et al. | |
| 6,274,904 B1* | 8/2001 | Tihanyi | 257/329 |
| 6,861,706 B2* | 3/2005 | Tihanyi | 257/342 |
| 2006/0006386 A1 | 1/2006 | Hirler et al. | |
| 2009/0189240 A1* | 7/2009 | Willmeroth et al. | 257/488 |

FOREIGN PATENT DOCUMENTS

| | | |
|---|---|---|
| DE | 10 229 488 | 4/2005 |
| DE | 10 2004 006001 | 6/2005 |
| DE | 10 2004 041198 | 3/2006 |

* cited by examiner

*Primary Examiner*—Thanh V Pham
*Assistant Examiner*—Andres Munoz
(74) *Attorney, Agent, or Firm*—Dicke, Billig & Czaja, PLLC (57) ABSTRACT

A semiconductor device with a field ring in an edge pattern of a semiconductor body with a central cell area and with field plate discharge pattern. The edge pattern exhibits at least one horizontal field plate which is arranged with one end over the field ring and with its other end on insulating layers towards the edge of the semiconductor body. A first ring-shaped area of a type of conduction doped complementary to a drift section material exhibits a field ring effect. A second highly doped ring-shaped area which contacts the one end of the horizontal field plate and forms a pn junction with the first ring-shaped area and which is arranged within the first area exhibits a locally limited punch-through effect or a resistive contact to the drift section material.

18 Claims, 5 Drawing Sheets

SEMICONDUCTOR DEVICE AND METHOD FOR PRODUCING IT

CROSS-REFERENCE TO RELATED APPLICATIONS

This Utility Patent Application claims benefit of German Patent Application 10 2007020 658.7, filed Apr. 30, 2007, incorporated herein.

BACKGROUND

The disclosure relates generally to a semiconductor device with a field ring or a number of field rings in an edge pattern which surrounds a central cell area and has one or more field plate discharge patterns. The semiconductor device has a semiconductor body which has in the cell area a first electrode which is electrically connected to a first near-surface zone of the semiconductor body. Furthermore, a second electrode which is electrically connected to a second zone of the semiconductor body is arranged on the rear side of the semiconductor body. Between the first and the second electrode, a drift section is arranged in the semiconductor body. The drift section material of the drift section also extends to the edge of the semiconductor body in the edge pattern. In the drift section material of the edge area, the field ring with complementary doping to the drift section is arranged which represents a protective effect for the cell area.

In such semiconductor devices, there is a risk that during a switching process in which the device changes from a non-conducting state into a conducting state, p-charge carriers, that is to say holes, cannot flow quickly enough into the floating area, with complementary doping to the drift section, of the field ring so that, for example, the horizontal field plate coupled to the field ring is capacitively pulled to a negative potential during the switching-on. This negative potential causes a depletion of charge in the drift section material until the potential of the horizontal field plates is raised again by leakage currents.

To maximize the blocking capability of a semiconductor device, a number of field rings can also be provided in each case combined with field plates and discharge patterns.

SUMMARY

In one embodiment, a semiconductor device with a field ring in an edge pattern of a central cell area and with field plate discharge pattern is created. The edge pattern has at least one field ring at which a horizontal field plate pattern is arranged. The field plate pattern is arranged on insulating layers towards the edge of the semiconductor body. A field ring effect is given by a first ring-shaped area with a type of conduction doped complementary to a drift section material. The first ring-shaped area forms a pn junction both with the drift section material and with a second highly doped ring-shaped area. For this purpose, the second area is arranged within the first ring-shaped area and contacts the horizontal field plate and has a locally limited punch-through effect to the drift section material. In this arrangement, the horizontal field plate is electrically connected both to the first area and to the second area.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope is defined by the appended claims.

Figure 1:
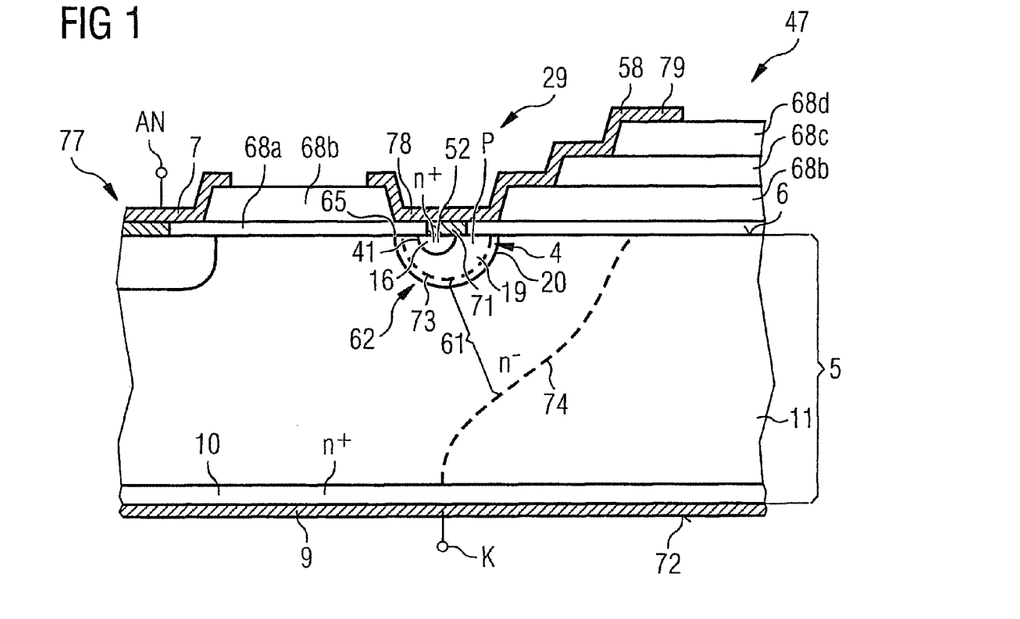
FIG. 1 illustrates a diagrammatic cross section through a semiconductor device according to one embodiment for the non-conducting case of a diode.

FIG. 1 illustrates a diagrammatic cross section through a semiconductor device 47 according to one disclosed embodiment. As illustrated in FIG. 1, this semiconductor device 47 is a diode with an anode AN on the top side 6 of a semiconductor body 5 and a cathode K on the rear side 72. This diode has as edge termination pattern a field ring 62 of a floating first area 19 with complementary doping to a drift section 11, and a discharge pattern 52 which interacts with a horizontal field plate 58. For this purpose, the horizontal field plate 58 is electrically connected to the electrically conductive contact 71.

In addition, the semiconductor device 47 has a central cell area 77 which is surrounded by the edge pattern 29 with the field ring 62 and with a field plate discharge pattern. For this purpose, the cell area 77 is electrically connected to an anode zone, with complementary conduction to the drift section 11, of the semiconductor body 5. The drift section 11 in the semiconductor body 5 also extends between the cell area 77 and the edge of the semiconductor body 5. The field plate 58 connected to the field ring 62 is horizontally stepped and arranged for this purpose towards the edge of the semiconductor body 5 on insulating layers 68a, 68b, 68c and 68d with increasing thickness of the insulating layers 68a, 68b, 68c and 68d and increasing distance of the horizontal field plate 58 from the top side 6 of the semiconductor body 5.

The field ring effect is achieved by the first ring-shaped area 19 of a complementary type of conduction. A highly doped ring-shaped second area 16 injecting or generating charge carriers, which has a punch-through effect to the drift section material of the edge area 30, establishes the contact to the horizontal field plate 58 and forms a pn junction 41 with the first ring-shaped area 19. In this arrangement, the second area 16 is arranged closer to a low voltage point 65 of the first area 19 than to all other points of the pn junction between drift section 11 and floating first area 19 with complementary doping.

Figure 2:
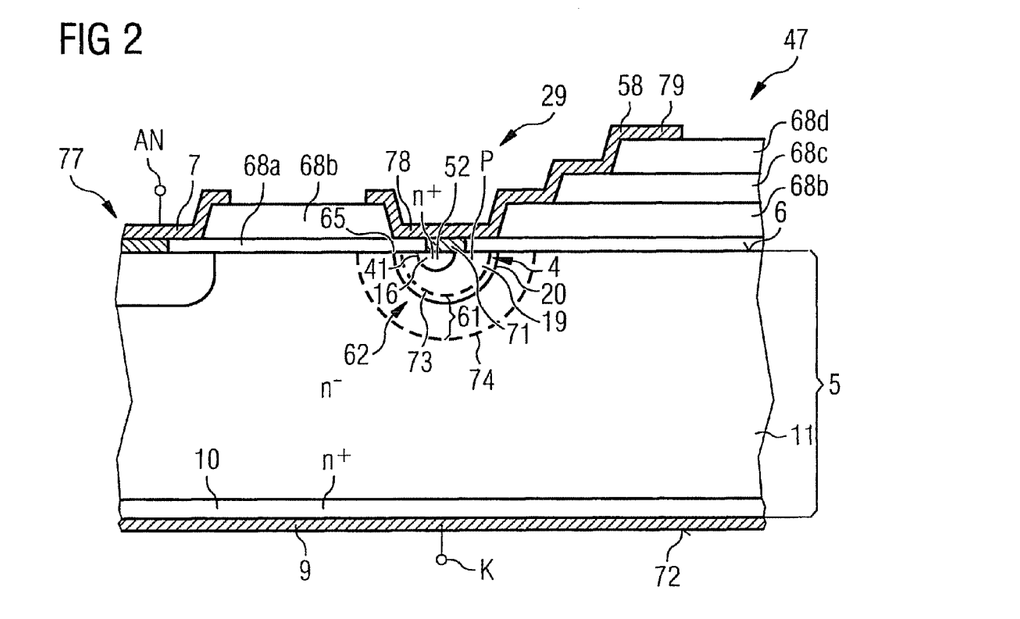
FIG. 2 illustrates a diagrammatic cross section through the semiconductor device according to FIG. 1 for the conducting case of a diode with a negatively charged field plate.

This edge structure 29 has the advantage that with a suitable lateral extent of the second area, in the non-conducting case as illustrated in FIG. 1, the space charge zone 61 does not reach the highly doped second area 16 and if the horizontally arranged step-shaped field plate 58 is negatively charged, a punch through of the space charge zone 61 occurs from the highly doped second area 16 to the similarly conductive drift section 11 in the conducting case as illustrated in FIG. 2. As a result, the horizontal field plate 58 and the floating field ring 62 with complementary doping can be quickly discharged via inflowing charge carriers from the second area 16 in the conducting case.

The distance between horizontal field plate 58 and the top side 6 of the semiconductor body 5 can increase towards the edge. This is achieved by applying a number of insulating layers 68a, 68b, 68c and 68d towards the edge and providing them with openings or windows which become larger step by step. An electrically conductive layer for a horizontal field plate 58 is then deposited on these oxide steps and patterned.

The locally limited effect of the punch-through effect is illustrated by FIG. 1 for the non-conducting case and FIG. 2 for the conducting case with a negatively charged field plate 58. For this purpose, the boundaries 73 and 74 of the space charge zones 61 are represented by dashed lines. In the non-conducting case, as mentioned above, the space charge zone 61 does not reach the $n^+$-conducting second area 16 of the discharge pattern 52 of the field ring 62 since the pn junction at the low voltage point 65 is weakly polarized in the forward direction and the space charge zone therefore extends only very little in the direction of the area 16 at this point. On switch-over into the conducting case, the space charge zone 61 punches through from the second $n^+$-conducting area 16 to the n-conducting drift section 11 with a negatively charged horizontal field plate 58, due to the punch-through effect and discharges the field plate 58.

Figure 3:
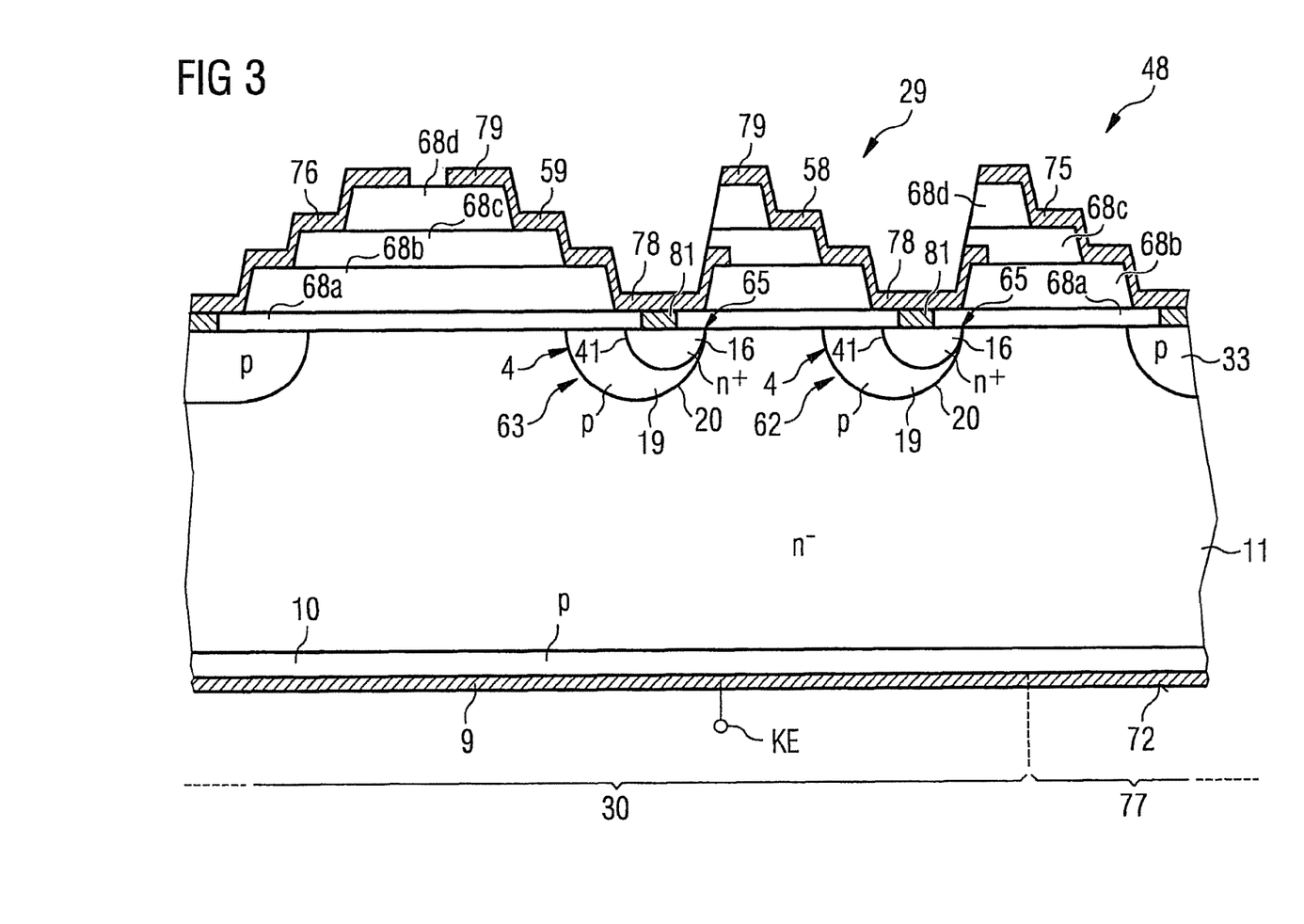
FIG. 3 illustrates a diagrammatic cross section through a semiconductor device according to a further embodiment.

FIG. 3 illustrates a diagrammatic cross section through a semiconductor device 48 according to a further embodiment of the invention. This FIG. 3 illustrates an edge termination of an IGBT or of a diode with a drift section 11, a rear collector electrode KE which is also called back side emitter, a cell area 77 on the right-hand side of FIG. 3 and an edge area 30 on the left-hand side of FIG. 3. In this further embodiment, two field rings 62 and 63 are provided in the edge area 30 as edge pattern 29, the structure of which corresponds to the field ring 62 of FIG. 1. The field rings 62 and 63 in each case interact with a stepped horizontal field plate 58 and 59 as is already illustrated in FIG. 1. Furthermore, a channel stopper with horizontally stepped field plate 76 is provided towards the edge. In addition, the last body zone 33 of the cell area 77 is also coupled to a horizontally stepped field plate 75. In this illustrative embodiment, the second $n^+$-conducting area 16 directly contacts the drift section 11 so that the discharge of the field plates 58 and 59 and 75 and 76 is also possible without punch-through effect. The advantage of this pattern is the fast discharge of the horizontal field plates without any threshold during the transition of the semiconductor device 48 from the non-conducting to the conducting state.

The electrically conductive material of the field plates can have a metal or be a highly doped, for example $n^+$- or $p^+$-conducting polysilicon. In both cases, resistive contacting by contact layers 81 is possible without problems, the field distribution within the field plate from one end 78 to the field plate 58 or 59, respectively, to the other end 79 of the field plate 58 or 59, respectively, exhibiting a constant potential. The insulating layer 68 which is arranged under the horizontal field plates 58 and 59, respectively, has, for example, silicon dioxide or silicon nitride, wherein the silicon dioxide can be formed by thermal oxidation of the silicon.

The edge pattern 29 according to the invention can be applied both to diodes and to MOSFETs and to IGBTs and to JFETs, for example. If the semiconductor device is constructed as a diode, the first electrode 7 is an anode and the second electrode 9 is a cathode. For this purpose, a first near-surface zone 8 of the semiconductor body 5 exhibits a first type of conduction and a second zone 10 of the semiconductor body 5 exhibits a type of conduction complementary to the first type of conduction, the dopant concentration of the drift section 11 being distinctly lower than the dopant concentration of the second zone 10 of the semiconductor body 5.

If the edge pattern 29 is used for a semiconductor device of the MOSFET type, the first electrode 7 has a source electrode and the second electrode 9 has a drain electrode. Below the source electrode and below the drain electrode, a highly doped semiconductor zone 8 or 10 respectively of the same type of conduction as the drift section 11 is arranged. In addition, this source semiconductor zone is surrounded by a body zone 33 of a type of conduction complementary to the drift section 11 and to the highly doped semiconductor zones 8 and 9, respectively. Although the structure is essentially identical in the semiconductor device of the MOSFET type and in the semiconductor device of the IGBT type, at least as far as the drift section 11 is concerned, the first electrode 7 is an emitter electrode and the second electrode 9 is a collector electrode KE.

In the IGBT, a highly doped emitter semiconductor zone of the same type of conduction as the drift section 11 is arranged below the emitter electrode, this emitter semiconductor zone being surrounded by a body zone 33 of a type of conduction complementary to the drift section 11, and a semiconductor zone, used as emitter, of the complementary type of conduction to the drift section 11 being arranged below the collector electrode. Seen from the emitter electrode, this thus results in an npnp structure via an insulated gate electrode for the conduction case by the combination of an n-channel MOS and pnp transistor, the base of the pnp transistor being driven via the MOS.

FIG. 4 illustrates a diagrammatic cross section through a semiconductor device area 57 with discharge pattern, inserted by masking technology, on a drift section 11. The so called low-voltage point 65 is thus located on the left-hand end of a floating complementary first area 19 to be inserted into the horizontal drift section 11.

Figure 4A:
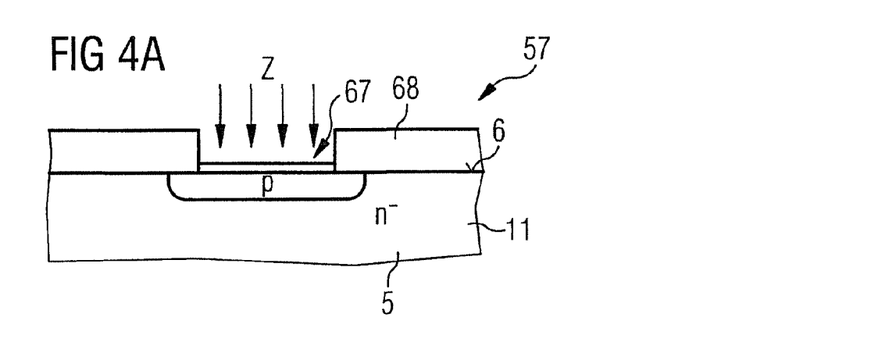
FIG. 4 illustrates a diagrammatic cross section through a semiconductor device area with discharge pattern inserted by masking technology on a laterally arranged drift section in an edge area.
Figure 4B:
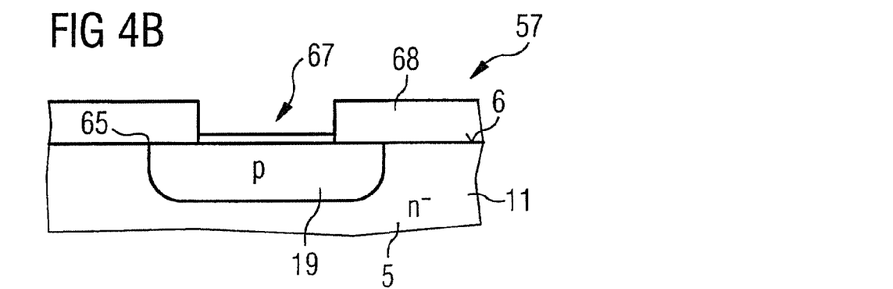
Figure 4C:
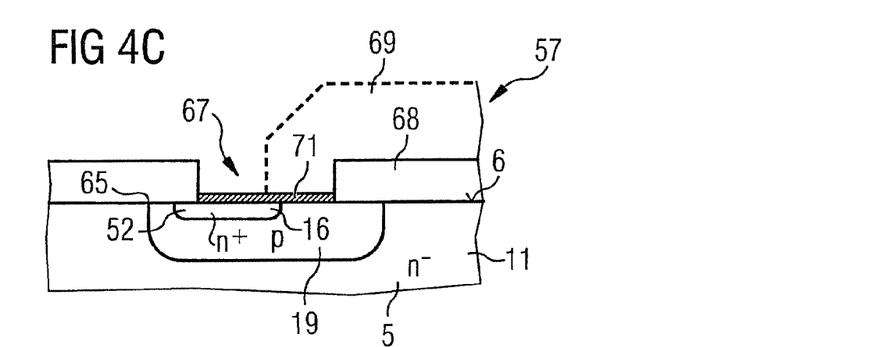

Firstly, as is illustrated in FIG. 4a), a window 67 is inserted into an insulating layer 68, for example of a silicon oxide, on the top side 6 of a semiconductor body 5 in the direction of the arrow Z, an acceptor material such as boron is implanted in the $n^-$-conducting material of the drift section 11 and diffused in. After a predetermined depth illustrated in FIG. 4b) of the first floating area 19 is reached, the window 67 is partially covered with a masking layer 69 as illustrated in FIG. 4c) and into the remaining window opening a second area 16 is highly doped by implantation and activation or slight diffusion of donor material such as arsenic or phosphorus. Following this, a conducting contact 71 is deposited in the window 67 which contacts both the first and the second area. However, in the case of a resistive transition from the n$^+$-conducting area to the n-conducting material of the drift zone 11, only the n$^+$-conducting area is contacted. However, in the case of the second area 16 fully embedded in the p-conducting first area 19, it can alternatively be arranged such that the conducting contact 71 only contacts the highly n-doped second area 16. Both vertical field plates in drift sections and horizontal field plates 58 and 59, respectively, on high-voltage field plate edges can be electrically connected to this conducting contact 71.

Figure 4D:
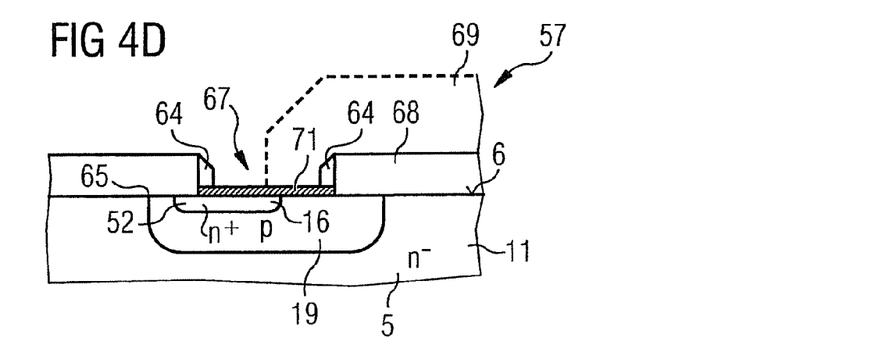

As illustrated here, this second area 16 is shielded from the second electrode by the first area 19 in the non-conducting case but provides for a punch-through effect on switch-over into the conducting case. As an alternative, as illustrated in FIG. 4d), a spacer 64 can be formed in the window 67 so that the outdiffusion of boron may be omitted so that no annealing and activating of the impurities after an ion implantation is required. The outdiffusion can also take place in one step if dopants are used, the diffusion coefficients of which are greatly different such as, for example, in the case of arsenic and boron. Similar process sequence can be carried out in the case where n$^+$-conducting areas are directly in contact with the drift section 11.

A method for producing a number of semiconductor chips for semiconductor devices 47 with a field ring is disclosed as follows. Firstly, a semiconductor wafer is prepared from a semiconductor body 5 with semiconductor component structures in semiconductor chip positions which are provided for lateral diode, MOSFET and/or IGBT structures in a central cell area 77 with a drift section 11 and an edge area 30. Following this, dopants of a complementary type of conduction to the drift section 11 are inserted in the edge area 30 for a floating first area 19 of a field ring 62 which surrounds the cell area 77.

After that, dopants of the same type of conduction as the drift section 11 are inserted in higher concentrations than the drift section 11 for a highly doped second area 16 which provides for a punch-through effect to the drift section 11, in such a manner that the second area 16 is surrounded by the first area 19. Furthermore, at least one additional insulating layer 68 adjoining the field ring 62 at the edge is applied and patterned. After that, a horizontal field plate 58 is applied to the additional insulating layer 68, contacting both the second area 16 and optionally the first area 19 of the field ring 62. After that, the lateral diode, MOSFET and/or IGBT patterns in the cell area are completed.

In this method, it is provided that the edge pattern 29 with the field ring 62 and the field plate 58 can be produced on semiconductor wafer basis even before the semiconductor wafer is separated into individual semiconductor chips. This reduces the cost of producing individual semiconductor chips. In addition, process steps for producing the cell area 77 can be used at the same time for process steps for realizing the edge pattern 29.

A further method for producing a number of semiconductor chips for semiconductor devices 48 with a field ring includes the following. Firstly, a semiconductor wafer is again prepared from a semiconductor body 5 with semiconductor component patterns in semiconductor chip positions which are provided for diode, MOSFET and/or IGBT patterns in a central cell area 77 with a drift section 11 and an edge area 30. After that, dopants of complementary types of conduction to the drift section 11 are inserted for a floating first area 19 of a field ring 62 into the edge area 30 which surrounds the cell area 77.

Following this, dopants of the same type of conduction as the drift section 11 are inserted in higher concentration than the drift section 11 for a highly doped second area 16 which has a resistive contact to the drift section 11, the second area 16 being partially surrounded by the first area 19. An additional insulating layer 68 adjoining the field ring 62 at the edge is now applied and patterned. On to this insulating layer 68, a horizontal field plate 58 is applied, contacting exclusively the second area 16 of the field ring 62, and then the diode, MOSFET and/or IGBT patterns in the cell area are completed.

In this method, it is again provided that the edge pattern 29 with the field ring 62 and the field plate 58 can be produced on semiconductor wafer basis even before the semiconductor wafer is separated into individual semiconductor chips. This reduces the cost of producing individual semiconductor chips. In addition, process steps for producing the cell area can be used at the same time for process steps for realizing the edge pattern 29.

To produce a number of semiconductor devices with a field ring, the following processes are carried out. The semiconductor wafer is separated into semiconductor chips. The semiconductor chips are applied to a device carrier having a number of external contacts in a number of semiconductor component positions. Following this, electrodes of the semiconductor chips are connected to contact pads which are electrically connected to external contacts. After that a semiconductor device package is applied with inclusion of the individual semiconductor chips and the connecting elements. Finally the device carrier is separated into individual semiconductor devices 48 with filed plate coupling pattern 4.

In this arrangement, the second area 16 is inserted into the top side 6 of the semiconductor body 5 in the edge area 30 close to a low-voltage point 65 of the first area 19. The first area 19 with complementary doping is inserted, forming a pn transition 20 to the drift section material before the insertion of dopants of identical conductivity as the drift section 11. With the insertion of the second area 16, a further pn junction with lower locking characteristics will be produced between first and second areas 19 and 16, respectively, so that the punch-through effect can be used. As an alternative, it is possible to insert the second area 16 overlapping the first area 19 at the low-voltage point 65 of the first area 19 in such a manner that the second area 16 forms a resistive contact to the drift section material.

Before dopants are inserted into the top side of the semiconductor body 5 for forming a field ring 62, a patterned masking layer 69 is first applied to the semiconductor wafer, which covers the surface areas of the semiconductor body 5 which are to be protected against penetration of dopant. In this context, for inserting the first area 19 with complementary doping, a masking layer having wider windows 67 for the penetration of dopant is applied than for the insertion of the highly doped second area 16 for which a masking layer 69 with windows 67 offset towards the cell area 77 is provided.

To insert dopants into windows 67 of the patterned masking layer 69, an ion implantation followed by a diffusion of the inserted dopants can be carried out. It is also possible to deposit, for inserting dopants a dopant-containing layer on the masking layer 69 patterned with windows 67 and then to carry out an in diffusion of the dopants into the semiconductor wafer.

To apply at least one additional insulating layer 68 adjoining the field ring 62 at the edge, silicon oxide or silicon nitride can be deposited and patterned. Following this, at least one horizontal field plate 58 is applied to the patterned insulating layer 68 in the edge area 30 by depositing an electrically conductive material and patterning it. For this purpose, a metal or a highly doped conductive polysilicon can be deposited. For this purpose, a chemical or physical deposition from the vapor phase of a conductive material can be carried out, or aluminium can be vapor-deposited.

FIGS. 5 to 10 diagrammatically illustrate in an overview the possible variations of the coupling between field plates 75 and highly doped near-surface areas 16 and 19, and of the coupling of the near-surface areas 16 and 19 with one another. Components having the same functions as in the preceding figures are marked by the same reference symbols and not especially explained. In this context, a semiconductor body is marked by 5, an insulating layer on the semiconductor body by 35, a drift section by 11, a field plate by 75 and a field plate contact by 34 in FIGS. 5 to 10. A first area highly doped complementary to the drift section 11 is marked by 19 and a second highly doped area of the same type of conduction as the drift section is marked by 16. The position of the low-voltage point of the drift section is marked by 65 and a charge carrier generation region is marked by 36.

Figure 5:
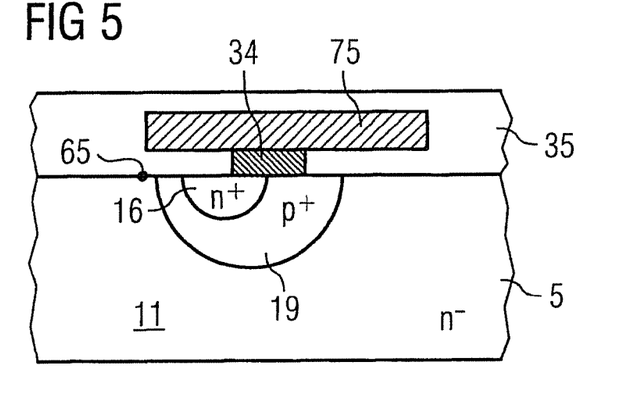
FIGS. 5 to 10 diagrammatically illustrate an overview of possible variations of the coupling between near-surface areas and the field plates.
Figure 6:
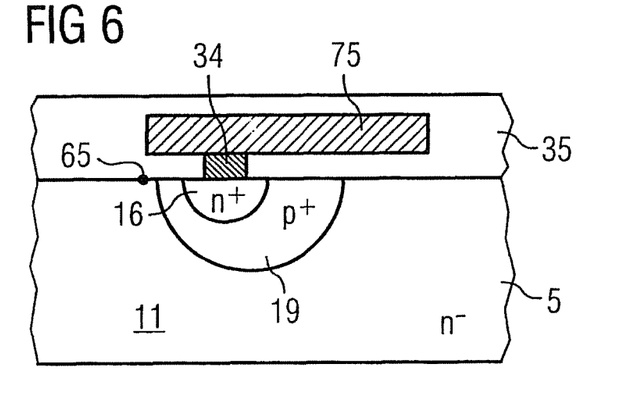
Figure 7:
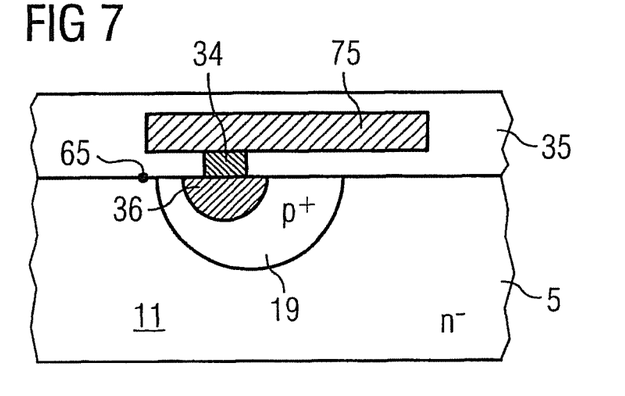

In the first three variations according to FIGS. 5 to 7, the punch-through effect is used, the second area 16 being arranged within the first area 19 and completely surrounded by it. In all three first variants according to FIGS. 5 to 7, the second area 16 is arranged asymmetrically in the first area 19 and displaced towards the low-voltage point.

The first three variants differ in that, in FIG. 5, the pn junction between area 16 and area 19 is short circuited by a resistive field plate contact 34.

In FIG. 16, the field plate 12 is only electrically connected resistively via the field plate contact 34 to the second area 16 with an effective Zener clamping with a low Zener voltage occurring between the first area 19 and the second area 16.

In the third variant according to FIG. 7, the second area is implemented by a metallic region 36 or another region 36 generating charge carriers. The coupling between the first area 19 and the second area is now effected by the characteristics of the generating region 36 itself.

Figure 8:
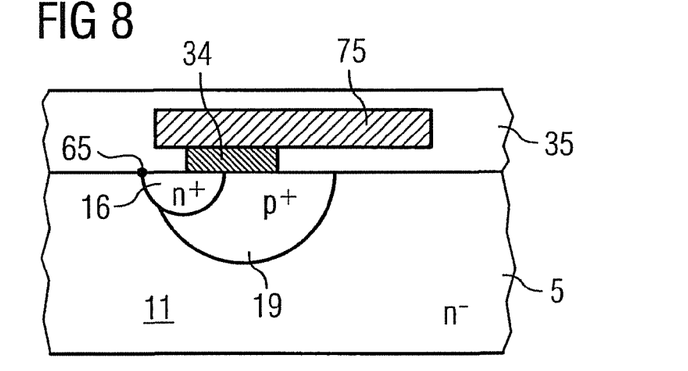
Figure 9:
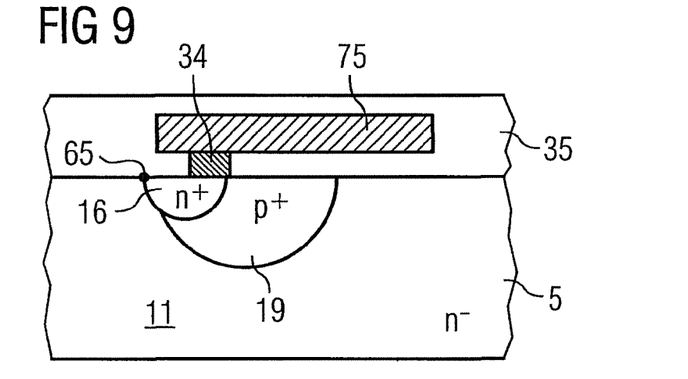
Figure 10:
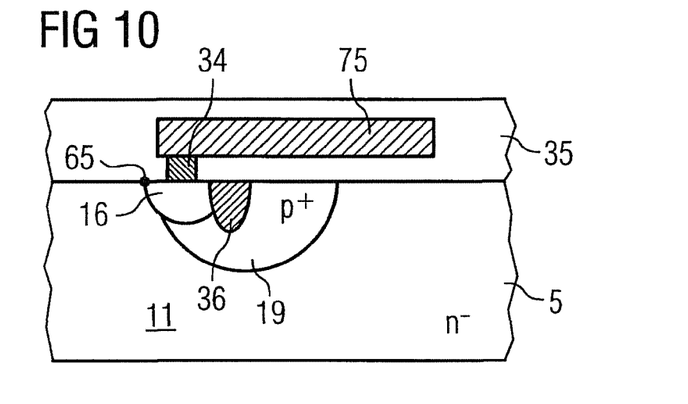

In all three other variants according to FIGS. 8 to 10, the second area 16 is at the low-voltage point of the drift section 11 and is in contact with the drift section 11. The other three variants according to FIGS. 8 to 10 differ in that, according to FIG. 8, a resistive contact through the field plate contact 34 short-circuits the two areas 16 and 19.

According to FIG. 9, the field plate contact 34 is only in resistive contact with the second area 16 so that Zener clamping with distinctly reduced Zener voltage compared with FIG. 6 is possible.

In the sixth variant according to FIG. 10, a region 36 with local generation centers is arranged between the first area 19 and the second area 16 so that the coupling takes place through the generating region 36, wherein the voltages between the first and second area 16 and 19, respectively, can only differ minimally.

Thus the semiconductor device with a field ring 62 in an edge pattern of a semiconductor body 5 with a central cell area 77 and with field plate discharge pattern 4, includes at least one horizontal field plate 58 which is arranged with one end over the field ring 62 and which is arranged with its other end on insulating layers 68 towards the edge of the semiconductor body 5. A first ring-shaped area 19 of a type of conduction doped complementary to a drift section material is provided. A second highly doped ring-shaped area 16 which contacts the one end of the horizontal field plate and forms a pn junction with the first ring-shaped area 19 and which is arranged within the first area 19 is included. The second area 16 exhibits a locally limited punch-through effect to the drift section material The first ring-shaped area 19 has a lateral extent which is adapted to the width of the conducting contact 71 of the field ring 62 while the lateral extent of the second area 16, which exhibits a locally limited punch-through effect to the drift section material, is limited in such a manner that the second area 16 is arranged ring-shaped within the first area 19 and which has a lateral extent which is smaller than that of the first ring-shaped area 19.

In an embodiment, a semiconductor device with a field ring 62 in an edge pattern of a semiconductor body 5 with a central cell area 77 and with field plate discharge pattern 4, includes at least one horizontal field plate 58 which is arranged with one end over the field ring 62 and which is arranged with its other end on insulating layers 68 towards the edge of the semiconductor body 5 and a first ring-shaped area 19 of a type of conduction doped complementary to a drift section material which contacts one end of the horizontal field plate as well as a second highly doped ring-shaped area 16 which forms a pn junction with the first ring-shaped area 19 and which is arranged within the first area 19. In this embodiment the horizontal field plate 58 has a resistive contact to the first and the second area 19, 16.

The first ring-shaped area 19 has a lateral extent which is adapted to the width of the conducting contact 71 of the field ring 62 whilst the lateral extent of the second area 16, with a locally limited punch-through effect to the drift section material, reaches a lateral extent which is smaller than that of the first ring-shaped area 19.

In another embodiment a semiconductor device with a field ring 62 in an edge pattern of a semiconductor body 5 with a central cell area 77 and with field plate discharge pattern 4, includes at least one horizontal field plate 58 which is arranged with one end over the field ring 62 and which is arranged with its other end on insulating layers 68 towards the edge of the semiconductor body 5, and a first ring-shaped area 19 of a type of conduction doped complementary to a drift section material as well as a second highly doped ring-shaped area 16 which contacts the one end of the horizontal field plate and forms a pn junction with the first ring-shaped area 19 and which is arranged within the first area 19. In this embodiment the second area 16 has a resistive contact to the drift section 11 and the horizontal field plate 58 is electrically connected to the second area 16.

In a further embodiment a semiconductor device with a field ring 62 in an edge pattern of a semiconductor body 5 with a central cell area 77 and with field plate discharge pattern 4, includes at least one horizontal field plate 58 which is arranged with one end over the field ring 62 and which is arranged with its other end on insulating layers 68 towards the edge of the semiconductor body 5, and a first ring-shaped area 19 of a type of conduction doped complementary to a drift section material, which contacts one end of the horizontal field plate as well as a second highly doped ring-shaped area 16 which forms a pn junction with the first ring-shaped area 19 and which is arranged within the first area 19. This embodiment includes only the second area 16 has a resistive contact to the field plate 58.

The first ring-shaped area 19 can have a lateral extent which is adapted to the width of the conducting contact 71 of the field ring 62 in such a manner that the second area 16 with the resistive contact to the drift section 11 extends to the lateral end of the first area 19, contacting the drift section 11, or protrudes on one side over the lateral extent of the first area 19 and contacts the drift section 11. Further, the horizontal field plate pattern is step-shaped towards the edge and is arranged on insulating layers 68 with increasing thickness It is possible that the edge pattern 29 includes a number of field rings 62, 63 in the semiconductor body 5 which are connected via a field plate discharge pattern 4 to field plates 58, 59 which are oriented in parallel with the field rings 62, 63 and are arranged stepped on insulating layers 68 with increasing thickness towards the edge, and wherein the cross section of the field plates 58, 59 exhibits a first and a second end 78, 79, wherein the first end 78 is at least coupled to the second highly doped area 16 of the discharge pattern and the second end 79 is arranged oriented towards the edge and insulated from the semiconductor body 5.

The first area 19, with complementary doping, of the field ring 62 can be arranged towards the edge and the second highly doped area 16 is arranged towards the central cell area 77, forming a pn junction with the first area 19 and insulating layers 68, on which the horizontal field plates 58, 59 are arranged, includes silicon dioxide, silicon nitride or polyimide.

The horizontal field plates 58, 59 can include an electrically conductive material, a metal or a highly doped polysilicon as electrically conductive material respectively creating a number of field plates 58, 59 which are arranged laterally behind one another in rings arranged in parallel with the edge and the discharge pattern for each field plate additionally provides a conductor track which electrically connects the field plates 58, 59 to at least the second areas 16 of the discharge pattern.

The semiconductor device can be a diode which has an anode AN as first electrode 7 and a cathode K as second electrode 9. In this case a first near-surface zone 8 of the semiconductor body 5 exhibits a first type of conduction and a second near-surface zone 10 of the semiconductor body 5 exhibits a type of conduction complementary to the first type of conduction, and wherein the drift section 11 includes the complementary type of conduction of the second semiconductor zone 10.

The second zone 10, below the second electrode 9, can include a higher dopant concentration than the drift section 11, in this case the semiconductor device is a MOSFET which exhibits a source electrode as first electrode 7 and a drain electrode as second electrode 9, wherein highly doped semiconductor zones 8, 10 of the same type of conduction as the drift section 11 are arranged below the source electrode and the drain electrode, and wherein the source semiconductor zone is surrounded by a body zone 33 of a type of conduction complementary to the drift section 11 and to the highly doped semiconductor zones 8, 10.

The semiconductor device can also be an IGBT which includes an emitter electrode as first electrode 7 and a collector electrode as second electrode 9, wherein a highly doped emitter semiconductor zone of the same type of conduction as the drift section 11 is arranged below the emitter electrode and wherein the emitter semiconductor zone is surrounded by a body zone 33 of a type of conduction complementary to the drift section 11, and wherein a drain semiconductor zone of the complementary type of conduction to the drift section 11 is arranged below the drain electrode.

A method for producing a number of semiconductor chips for semiconductor devices 47 with a field ring, includes the following.

At first a semiconductor wafer from a semiconductor body 5 with semiconductor component structures in semiconductor chip positions which are provided for diode, MOSFET and/or IGBT structures in a central cell area. Then a drift section 11 and an edge area 30 is prepared. Dopants of a complementary type of conduction are inserted into the drift section 11 in the edge area 30 which surrounds the cell area 77, for a floating first area 19 of a field ring 62

Dopants of the same type of conduction as the drift section having a higher concentration than the drift section 11 for a highly doped second area 16 are inserted, and provide a punch-through effect to the drift section 11, the second area 16 being surrounded by the first area 19. After that an applying and patterning of at least one additional insulating layer 68 adjoining the field ring 62 at the edge is processed. A horizontal field plate 58 is added to the insulating layer 68, contacting at least the second area 16 of the field ring 62 and a completing of diode-, MOSFET- and/or IGBT-structures in the cell area.

Another embodiment of a method for producing a number of semiconductor chips for semiconductor devices 47 with a field ring includes the following. At first a semiconductor wafer from a semiconductor body 5 with semiconductor component structures in semiconductor chip positions is prepared which are provided for diode, MOSFET and/or IGBT structures in a central cell area 77 with a drift section 11 and an edge area 30. At first dopants of a complementary type of conduction to the drift section 11 in the edge area 30 which surrounds the cell area 77, for a floating first area 19 of a field ring 62 are inserted and dopants of the same type of conduction as the drift section in higher concentrations than the drift section 11 for a highly doped second area 16 which exhibits a resistive contact to the drift section 11, are then implanted. At least one additional insulating layer 68 adjoining the field ring 62 at the edge is applied and patterned, and a horizontal field plate 58 is added to the insulating layer 68, contacting exclusively the second area 19, 16 of the field ring 62. After that, the diode, MOSFET and/or IGBT structures in the cell area is completed.

The second area 16 is inserted into the top side 6 of the semiconductor body 5 in the edge area 30 close to a low-voltage point 65 of the first area 19 and the first area 19 with complementary doping is inserted by forming a pn transition 20 to the drift section material before the insertion of dopants of the same conductivity as the drift section 11 and, with the insertion of the second area 16, a further pn junction having lesser locking characteristics is produced between the first and second areas 19, 16 so that the punch-through effect can be used.

The second area 16 is inserted overlapping the first area 19 at the low-voltage point 65 of the first area 19 in such a manner that the second area 16 forms a resistive contact to the drift section 11 and before dopants are inserted, a patterned masking layer 69 is first applied to the semiconductor wafer which covers the surface areas of the semiconductor body 5 which are protected against penetration of dopant.

For inserting the first area 19 with complementary doping, a masking layer having wider windows 67 for the penetration of dopant is applied than for the insertion of the highly doped second area 16 for which a masking layer 69 with windows 67 offset towards the cell area 77 is provided and for inserting dopants into windows 67 of the patterned masking layer 69, an ion implantation followed by diffusion of the inserted dopants is carried out.

Alternatively, a dopant-containing layer can be deposited on the masking layer 69 patterned with windows 67 and, following this, an diffusion of the dopants into the semiconductor wafer is carried out. For applying at least one additional insulating layer 68 adjoining the field ring 62 at the edge, silicon oxide or silicon nitride is deposited, and for applying a horizontal field plate 58, an electrically conductive material is deposited and patterned in the edge area 30.

A metal or a highly doped conductive polysilicon is deposited for applying a horizontal field plate 58 in the edge area 30. Also a currentless chemical or physical deposition from the vapor phase of a conductive material can be carried out in the edge area 30 for applying a horizontal field plate 58.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device with a field ring in an edge pattern of a semiconductor body with a central cell area and with field plate discharge pattern, comprising:
   at least one horizontal field plate which is arranged with one end over the field ring and which is arranged with its other end on insulating layers towards the edge of the semiconductor body;
   a floating first ring-shaped area of a type of conduction doped complementary to a drift section material; and
   a second highly doped ring-shaped area which contacts the one end of the horizontal field plate and forms a pn junction with the first ring-shaped area and which is arranged within the floating first ring-shaped area;
   wherein the second highly doped ring-shaped area exhibits a locally limited punch-through effect to the drift section material.

2. The semiconductor device of claim 1, wherein the first ring-shaped area has a lateral extent which is adapted to the width of the conducting contact of the field ring while the lateral extent of the second area, which exhibits a locally limited punch-through effect to the drift section material, is limited in such a manner that the second area is arranged ring-shaped within the first area and which has a lateral extent which is smaller than that of the first ring-shaped area.

3. The semiconductor device of claim 1, wherein the horizontal field plate has a resistive contact to the first and the second area.

4. The semiconductor device of claim 1, wherein the first ring-shaped area has a lateral extent which is adapted to the width of the conducting contact of the field ring while the lateral extent of the second area, with a locally limited punch-through effect to the drift section material, reaches a lateral extent which is smaller than that of the first ring-shaped area.

5. The semiconductor device of claim 1, wherein the horizontal field plate pattern is step-shaped towards the edge and is arranged on insulating layers with increasing thickness.

6. The semiconductor device according claim 1, wherein the edge pattern includes a number of field rings in the semiconductor body which are connected via a field plate discharge pattern to field plates which are oriented in parallel with the field rings and are arranged stepped on insulating layers with increasing thickness towards the edge.

7. The semiconductor device according claim 1, wherein the cross section of the field plates includes a first and a second end, wherein the first end is at least coupled to the second highly doped area of the discharge pattern and the second end is arranged oriented towards the edge and insulated from the semiconductor body.

8. The semiconductor device of claim 1, wherein the first area, with complementary doping, of the field ring is arranged towards the edge and the second highly doped area is arranged towards the central cell area, forming a pn junction with the first area.

9. The semiconductor device of claim 1, wherein the insulating layers, on which the horizontal field plates are arranged, includes silicon dioxide, silicon nitride or polyimide.

10. The semiconductor device of claim 1, wherein the horizontal field plates include an electrically conductive material.

11. The semiconductor device of claim 1, wherein the horizontal field plates include a metal.

12. The semiconductor device of claim 1, wherein the horizontal field plates include a highly doped polysilicon as electrically conductive material.

13. The semiconductor device of claim 1, wherein a number of field plates are arranged laterally behind one another in rings arranged in parallel with the edge and the discharge pattern for each field plate additionally provides a conductor track which electrically connects the field plates to at least the second areas of the discharge pattern.

14. The semiconductor device of claim 1, wherein the semiconductor device is a diode which has an anode as first electrode and a cathode as second electrode.

15. The semiconductor device of claim 14, wherein a first near-surface zone of the semiconductor body includes a first type of conduction and a second near-surface zone of the semiconductor body includes a type of conduction complementary to the first type of conduction, and wherein the drift section exhibits the complementary type of conduction of the second near-surface zone.

16. The semiconductor device of claim 14, wherein the second zone, below the second electrode, includes a higher dopant concentration than the drift section.

17. The semiconductor device of claim 1, wherein the semiconductor device is a MOSFET which includes a source electrode as first electrode and a drain electrode as second electrode, wherein highly doped semiconductor zones of the same type of conduction as the drift section are arranged below the source electrode and the drain electrode, and wherein the source semiconductor zone is surrounded by a body zone of a type of conduction complementary to the drift section and to the highly doped semiconductor zones.

18. The semiconductor device of claim 1, wherein the semiconductor device is an IGBT which includes an emitter electrode as first electrode and a collector electrode as second electrode, wherein a highly doped emitter semiconductor zone of the same type of conduction as the drift section is arranged below the emitter electrode and wherein the emitter semiconductor zone is surrounded by a body zone of a type of conduction complementary to the drift section, and wherein a drain semiconductor zone of the complementary type of conduction to the drift section is arranged below the drain electrode.

* * * * *